United States Patent [19]

Beason et al.

[11] Patent Number: 5,654,718
[45] Date of Patent: Aug. 5, 1997

[54] GPS RECEIVER DEVICE AND METHOD FOR CALIBRATING A TEMPERATURE UNCOMPENSATED CRYSTAL OSCILLATOR

[75] Inventors: Lawrence W. Beason, Olathe, Kans.; Ronald T. Chinnery, Independence; Stephen Davis, Blue Springs, both of Mo.; Jay Dee Krull, Olathe, Kans.

[73] Assignee: Garmin Corporation, Olathe, Kans.

[21] Appl. No.: 751,385

[22] Filed: Nov. 19, 1996

Related U.S. Application Data

[63] Continuation of Ser. No. 319,077, Oct. 6, 1994, abandoned.

[51] Int. Cl.⁶ ............................. G01S 5/02; G01J 5/00
[52] U.S. Cl. ............................. 342/357
[58] Field of Search ............................. 342/357; 331/65, 331/66, 176, 175, 158

[56] References Cited

U.S. PATENT DOCUMENTS

| | | | |
|---|---|---|---|
| 4,380,745 | 4/1983 | Barlow et al. | 331/176 |
| 4,921,467 | 5/1990 | Lax | 331/176 |
| 5,081,431 | 1/1992 | Kubo et al. | 331/158 |
| 5,172,075 | 12/1992 | Yerbury et al. | 331/14 |
| 5,225,842 | 7/1993 | Brown et al. | 342/357 |
| 5,323,164 | 6/1994 | Endo | 342/357 |
| 5,392,005 | 2/1995 | Bortolini et al. | 331/44 |

Primary Examiner—Gregory C. Issing
Attorney, Agent, or Firm—Kokjer, Kircher, Bowman & Johnson

[57] ABSTRACT

A device and method for compensating a crystal oscillator that is not electrically compensated over its operable temperature range. A GPS receiver device stores in memory data indicative of the actual offset frequency of oscillation of the crystal over its operable temperature range. The first time the device is activated, the temperature at the crystal is sensed and data, stored in memory, indicative of the specified frequency offset of the crystal at the sensed temperature is retrieved, and used to control the receiver\decoder. When the receiver locks onto a sufficient number of satellites to calculate its two-dimensional location, the actual frequency offset of the crystal is calculated and stored in memory. Repeated use of the receiver device permits a database of actual frequency offset data of the crystal, over its operable temperature range to be stored. Subsequent uses of the device permit retrieval of this data for use in locking the receiver onto satellite signals. If such data is not available, the device uses the average offset data at the given temperature. The device further adjusts the offset data originally retrieved or computed until the receiver locks onto the desired signal.

13 Claims, 4 Drawing Sheets

GPS RECEIVER DEVICE AND METHOD FOR CALIBRATING A TEMPERATURE UNCOMPENSATED CRYSTAL OSCILLATOR

This is a continuation of application Ser. No. 08/319,077, filed Oct. 6, 1994, now abandoned.

BACKGROUND OF THE INVENTION

1. Field of the Invention

The present invention is generally directed to a receiver used in a global positioning system (GPS). More particularly, the present invention is related to a device and method for automatically calibrating a temperature uncompensated crystal oscillator utilized in a GPS receiver device.

2. Description of the Related Art

Very generally, a GPS is an electronic satellite navigation system which permits a user of the system to determine his or her position with respect to the Earth. Global positioning is accomplished through use of a hand-held receiver device which detects signals from a number of satellites orbiting the Earth. As described in greater detail below, finding the position of the GPS receiver is accomplished after the receiver acquires and decodes a sufficient number of GPS satellite signals, enabling it to calculate the position of the receiver, based upon its position with respect to the various satellites. Accordingly, GPS receivers are highly valuable and widely used in navigational systems because of their ability to accurately compute the user's position on or near the Earth in real time, even as the user moves, in addition to being able to calculate the velocity at which the user is moving in three dimensions. Currently, the satellite system from which GPS receivers acquire information is the NAVSTAR Global Positioning System controlled by the United States Defense Department.

To decode these satellite signals, known as spread spectrum signals, and thereby calculate the desired navigational data, a GPS receiver must first "find" or acquire the signals emitted from a minimum number of satellites. Once the receiver is "locked on" to the signals, continuous real time calculation and monitoring of the user's global position and other navigational data, such velocity of movement, can be performed. GPS receivers also keep time.

In this regard, GPS receivers require a highly accurate internal frequency reference in order to acquire the spread spectrum GPS satellite signals. Specifically, acquiring spread spectrum satellite signals from a sufficient number of satellites to perform calculations requires determining the frequency of oscillation of the crystal oscillator utilized in the GPS receiver.

Conventional prior art GPS receivers typically use a temperature compensated crystal oscillator to provide the necessary stable and accurate internal frequency standard. Such temperature compensated crystals, such as quartz, exhibit electromechanical-resonance characteristics that are very stable with time and temperature and highly selective. Accordingly, they are very useful for minimizing acquisition times of the satellite signals and, accordingly, the period of time that it initially takes the GPS receiver to acquire and decode (and therefore "lock on" to) spread spectrum satellite signals.

To minimize the amount of time that it initially takes the receiver to acquire the spread spectrum satellite signals, conventional prior art GPS receivers typically require a frequency drift of approximately +/−1.0 PPM (parts per million), or less, throughout the temperature range of the crystal. In other words, to reduce the crystal oscillator's possible frequency error through which a receiver must search when seeking to acquire satellite signals and thereby determine the exact oscillation frequency of the receiver's crystal oscillator, prior art devices compensate the crystal oscillator over its operable temperature range. To accomplish the accuracy required, the crystal must be extensively calibrated, using electronic circuitry which must be tailored to the crystal, and tested at various temperatures.

More specifically, a characteristic of quartz crystal oscillators is that their frequency of oscillation drifts over their operative temperature range. Quartz crystal oscillator frequency drifts are somewhat predictable if the temperature of the crystal is known. In this regard, all quartz crystals, used in oscillators, have a frequency drift over its operating temperature range. This phenomenon is conventionally referred to as the "S-curve" of the crystal due to the typical shape of the plot of the quartz crystal's frequency drift in response to temperature change. Such S-curves are tailored by crystal manufacturers for specific frequency deviations over specific temperature ranges, but can never be eliminated. Stated differently, all quartz crystals experience a drift in frequency from the nominal frequency of the crystal in response to temperature changes of the crystal. As stated above, since the required frequency accuracy of a conventional GPS receiver is typically +/−1 PPM throughout the operating temperature range of the crystal, and since uncompensated crystals have a drift of far greater than that accuracy, expensive electronic circuits must be built which compensate the crystal to approximately +/−1 PPM throughout the operating temperature range of the product. In other words, to form a temperature compensated crystal oscillator, prior art GPS receivers require a circuit which minimizes the effect of temperature on the oscillation frequency of the crystal oscillator.

Such temperature compensation techniques, although resulting in a useful product, require intense, expensive, and time-consuming procedures causing the overall crystal oscillator circuit used in the GPS receivers to be very expensive relative to the cost of an uncompensated crystal oscillator. Furthermore, although the use of a temperature compensated crystal oscillator may significantly reduce the time period necessary for a GPS receiver to initially acquire spread spectrum satellite signals, such receivers may still have significant delays (possibly up to several minutes) in initially acquiring the satellite signals necessary for computation of navigational data.

In view of the expensive and time-consuming procedures necessary to develop temperature compensated crystal oscillators, it would be desirable to use an ordinary uncompensated crystal oscillator in GPS receivers. However, use of an uncompensated crystal oscillator has significant drawbacks in that the receiver, because the oscillator is uncompensated throughout its temperature operating range, must search through many possible frequencies when searching for the spread spectrum satellite signals, due to the unknown exact frequency of the GPS receiver's crystal oscillator.

Accordingly, the need exists for an inexpensive crystal oscillator for GPS receivers. More particularly, the need exists for an inexpensive crystal oscillator which achieves the internal frequency standard accuracy desired in a GPS receiver. The present invention overcomes the foregoing drawbacks and fills these and other needs.

SUMMARY OF THE INVENTION

It is an object of the present invention to provide an inexpensive crystal oscillator for use in GPS receivers.

It is another object of the present invention to provide an inexpensive device and method for achieving the internal frequency standard accuracy required-and desired in a GPS receiver.

It is a further object of the present invention to provide a GPS receiver which quickly acquires spread spectrum GPS satellite signals through use of a non-electrically temperature-compensated crystal oscillator.

It is a further object of the present invention to provide a GPS satellite receiver having a crystal oscillator which does not require an electronic temperature compensation circuit, but which quickly and efficiently acquires spread spectrum GPS satellite signals.

It is yet another object of the present invention to provide a GPS receiver device which uses known values of oscillation offset frequency of the crystal oscillator in the receiver device at certain temperatures to predict the oscillation frequency of the crystal oscillator at a specific temperature at which the oscillator is operating.

It is yet another object of the present invention to provide a GPS satellite receiver that continuously monitors the temperature of the crystal and which continuously compares its oscillation frequency to the GPS satellite frequency standard.

The foregoing and other objects are accomplished by a device and method for automatically calibrating an uncompensated crystal oscillator in a GPS receiver device. A GPS receiver is coupled with a crystal oscillator. A temperature sensor, which is in close proximity to the crystal, and the receiver are coupled with the central processing unit (CPU) of a microprocessor. The CPU circuitry has a real-time clock and memory storage capabilities. A display and keyboard may optionally be coupled with the CPU.

The S-curve data of the crystal is typically provided in a range of upper and lower limits in parts per million over the temperature operating range of the crystal. According to the principles of the present invention, the average of the upper and lower limits of this frequency drift, at each degree celsius over the operating range of the crystal, is calculated. The resulting curve represents the average drift over the temperature range of the crystal. This data is stored in permanent memory within the GPS receiver.

The first time the GPS receiver device of the present invention is activated, the GPS receiver begins its attempts to acquire spread spectrum GPS satellite signals. Actual temperature information at the crystal is sensed by the temperature sensor and sent to the CPU. The CPU receives the temperature information (in degrees Celsius) and recalls from memory the specified average crystal frequency drift, at this known temperature, that was previously stored in permanent Read-Only memory. If the frequency stored in memory at that precise operating temperature precisely matches the frequency standard of a sought GPS spread spectrum satellite signal, the receiver will be in tune with the satellite transmission and will immediately lock on to the satellite signal it is seeking. However, if the average frequency offset from the nominal frequency of the oscillator did not result in the acquisition of a satellite signal, then, according to the principles of the present invention, the CPU will assume an oscillator offset slightly more than the value previously stored in Read-Only memory. If acquisition is still not successful, the GPS receiver will then assume an oscillator offset slightly less than the originally stored value. This process is repeated until signal acquisition is successful.

Once acquisition of sufficient satellite signals has been established, the GPS receiver of the present invention will then calculate its two-dimensional position (in latitude and longitude). Once this previously unknown variable has been eliminated, and the GPS receiver "knows" its exact position relative to the satellites from which it is receiving signals, the GPS receiver device will then calculate an exact frequency offset of its internal crystal oscillator at the temperature currently being measured at the crystal.

This new "exact" offset data is then stored in a selected area of Read-Write memory. This specified area of memory allows one frequency offset value for every possible operating temperature, in degrees Celsius. As the receiver is continually used over a wide range of temperatures, this area of memory is filled with these exact temperature-to-frequency offset values.

The satellite signal acquisition process is slightly different for operations of the GPS receiver device of the present invention, subsequent to its initial (first time) use. When activated, the CPU will look into Read-Write memory to "see" if actual frequency offset data is available. If it is, then the actual frequency offset data is used for satellite signal acquisition, instead of the average values originally stored in Read-Only memory.

Accordingly, as the device of the present invention is used, it "learns" the exact frequency offset from the nominal frequency of the internal crystal during normal operation as it is exposed to various temperatures. In this way, the average S-curve, stored in table form in a Read-Only memory (ROM), is constantly updated to a table which stores, in a Read-Write memory (SRAM), the actual offset values at specific temperatures. As the device is used, and actual values are stored in Read-Write memory, the software of the present invention gives this updated, "true offset" data precedence over the initial typical "average" data that was stored in the first memory.

As a result of the device and methods of the present invention, satellite acquisition time is drastically reduced. Furthermore, because the device is self-teaching, expensive temperature testing and compensation of the crystal utilized in the receiving device are not required.

BRIEF DESCRIPTION OF THE DRAWINGS

The objects and features of the invention noted above are explained in more detail with reference to the drawings, in which like reference numerals denote like elements, and in which.

DETAILED DESCRIPTION OF THE INVENTION

Figure 1:
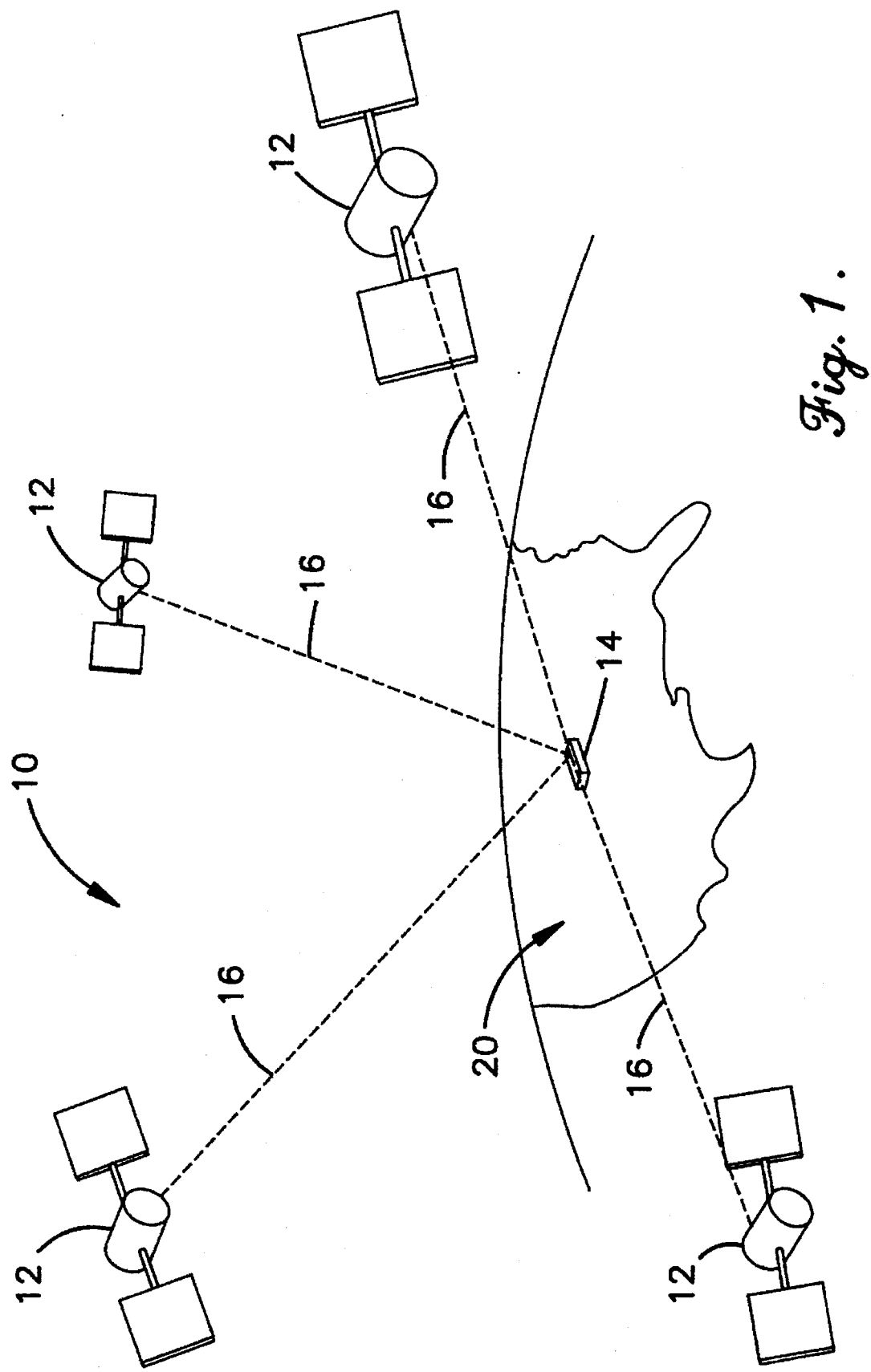
FIG. 1 is representative of a GPS.

With reference initially to FIG. 1, a satellite global positioning system (GPS) is denoted generally by the reference numeral 10. A plurality of satellites 12 are in orbit about the Earth 20. It is believed that, when completely operational, the NAVSTAR GPS is intended to utilize up to twenty-four satellites 12 orbiting the Earth 20. The orbit of each satellite 12 in FIG. 1 is not necessarily synchronous with the orbits of other satellites and, in fact, is likely asynchronous. A GPS receiver device 14 of the present invention is shown receiving spread spectrum GPS satellite signals 16 from the various satellites 12.

It will be appreciated by those skilled in the art that GPS receiver device 14 must acquire spread spectrum GPS satellite signals 16 from at least three satellites 12 for GPS receiver device 14 to calculate (by triangulation) its two-dimensional position. Acquisition of an additional signal 16, resulting in signal acquisitions from a total of four satellites, permits GPS receiver device 14 to calculate its three-dimensional position.

The spread spectrum signal 16 continuously transmitted from each satellite 12 utilizes a highly accurate frequency standard. In this regard, the satellites of the NAVSTAR Global Positioning System utilize on-board extremely accurate atomic clocks for their frequency standard. Each satellite 12, as part of its data signal transmission, transmits a digital data stream indicative of that particular satellite. In other words, each satellite 12 transmits a stream of digital bits which exclusively identifies that particular satellite.

It will further be understood by those skilled in the art that movement of satellites 12 (relative to receiver device 14) through their non-synchronous orbits about the Earth 20 causes Doppler shifting of the satellite signal 16 frequencies. Accordingly, the GPS receiving device 14 must know precise quantity and direction of the Doppler shift of each satellite signal 16.

Figure 2:
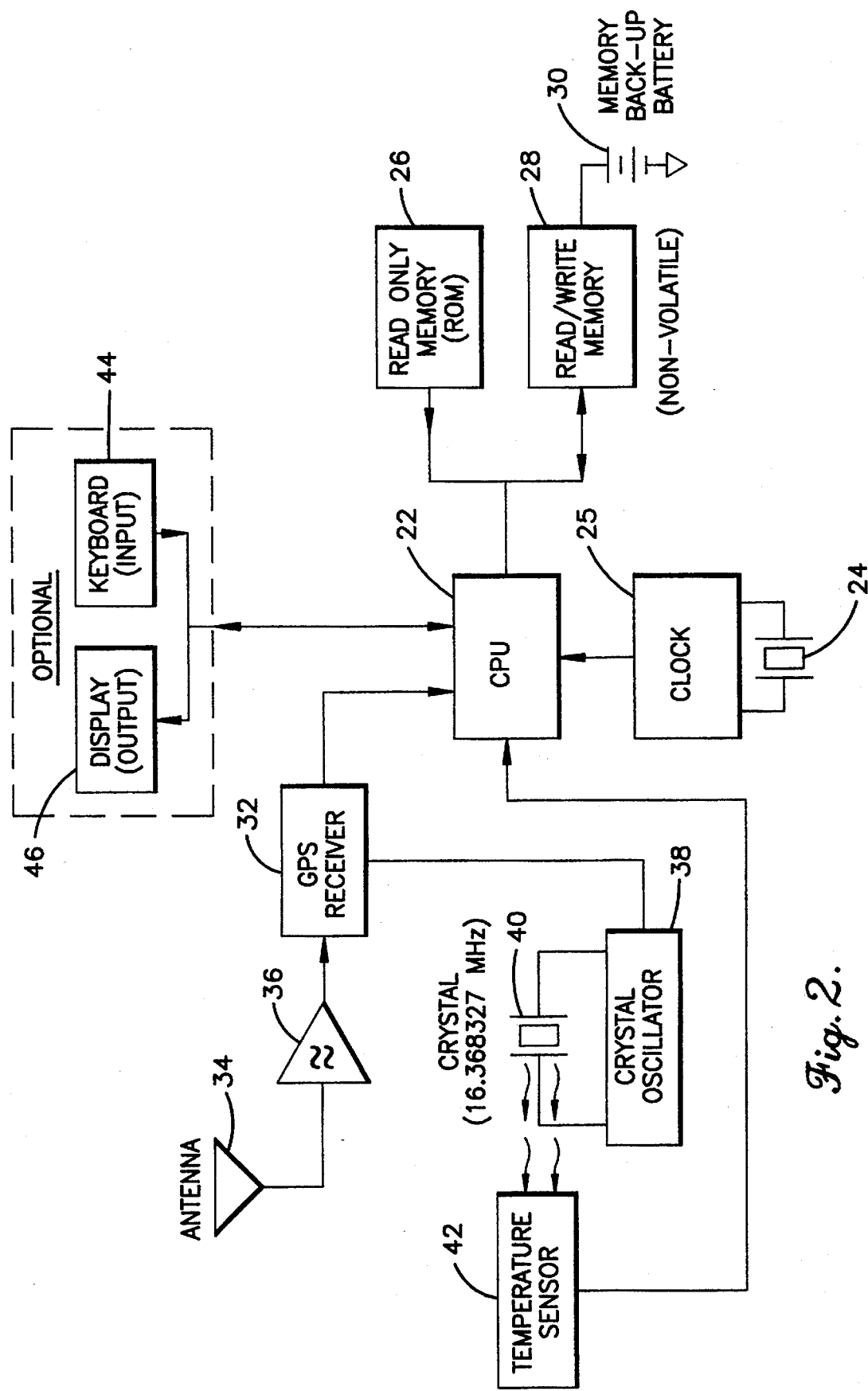
FIG. 2 is a block circuit diagram of the GPS receiver and control circuitry of the present invention.

With reference now to FIG. 2, the components of the preferred embodiment of the GPS receiver device 14 for automatically calibrating an uncompensated crystal oscillator of the present invention are shown and described. GPS receiver device 14 utilizes a microprocessor having a CPU 22. CPU 22 has a real-time clock 25 connected to CPU 22. Real-time clock uses crystal 24 for tracking time. Connected to CPU 22 are read-only memory device 26 for permanent memory storage and a non-volatile Read-Write static RAM memory device 28 for temporary memory storage. A memory back-up battery 30 is connected between ground and the static RAM device 28.

A receiver\decoder 32 is coupled to CPU 22. An antenna 34 is connected through an amplifier 36 to the GPS receiver\decoder 32. A crystal oscillator 38 utilizing a piezo-electric quartz crystal 40, preferably having a nominal frequency of approximately 16.368327 Mhz, is connected with the GPS receiver\decoder 32. It will be appreciated that other nominal frequencies could be utilized. Crystal 40 is not compensated over its operable temperature range. A temperature sensor 42 is placed in close proximity to crystal 40. Temperature sensor 42 is connected with CPU 22.

The foregoing described circuit components are preferably encased within a housing (not shown) capable of being hand-held. An input 44 (which may be a keyboard), and a display 46, which serves as an output device, are optionally connected with CPU 22 and accessible from the outside of the housing in which the other components of GPS receiver device 14 are located.

Figure 3:
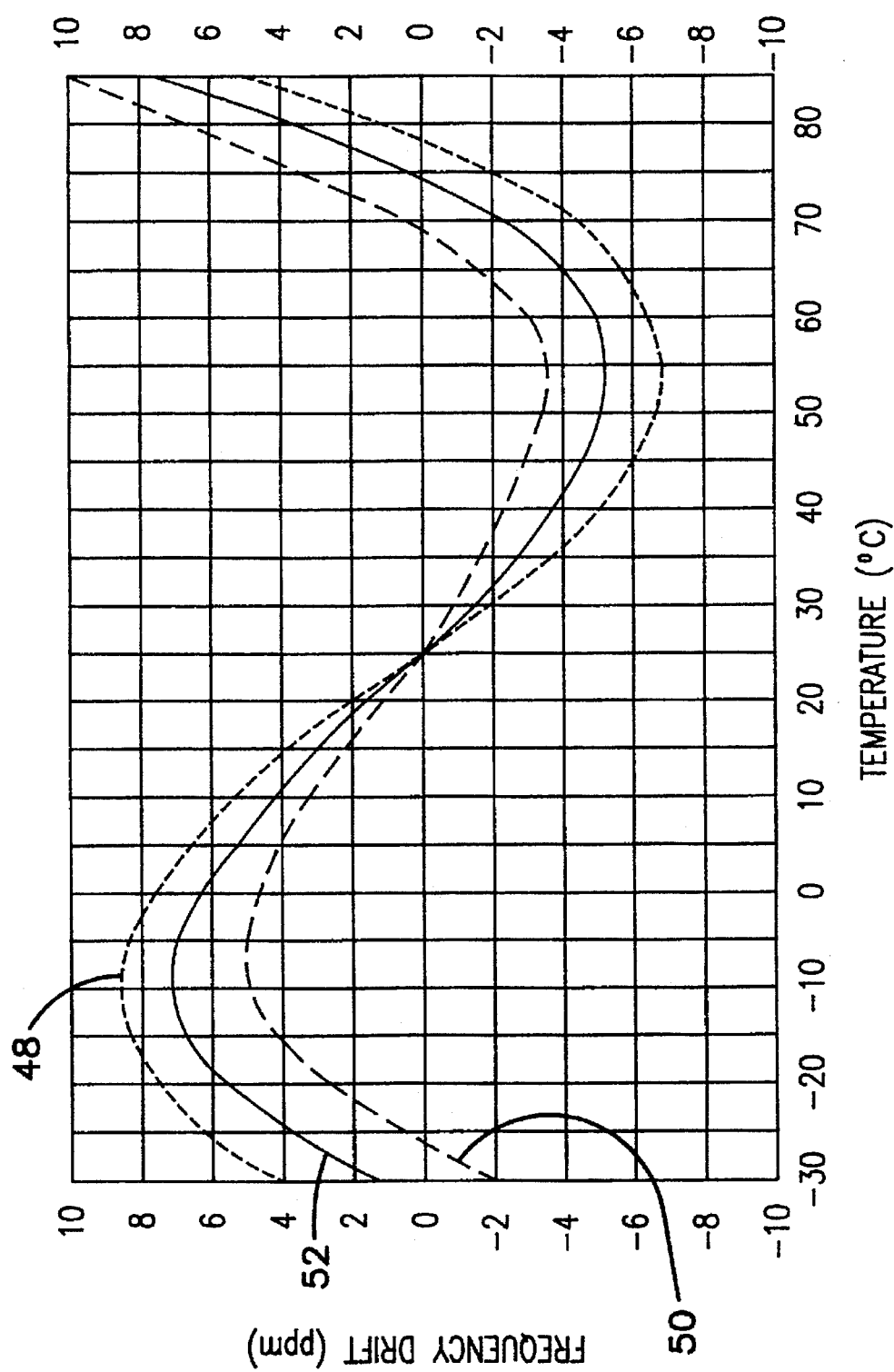
FIG. 3 is a graph of an S-curve of a typical crystal for use in a crystal oscillator.

As described above, the frequency drift characteristics of crystal 40 are stored in a table form in ROM device 26. FIG. 3 illustrates an S-curve graph such as would be associated with crystal 40. The dashed lines 48, 50 are indicative of the range of frequency drift in parts per million (PPM) of the particular crystal 40. In accordance with the principles of the present invention, these outer limit values are averaged at each temperature degree and stored in table format in permanent memory in the ROM device 26. It will be appreciated that the average values may be taken at any selected increment of temperature. The solid S-curve line 52 is indicative of a plot of the average frequency drift values over the operative temperature range of crystal 40.

Stored in Read-Write SRAM memory 26, is informational data about the orbits of each of the satellites 12 orbiting the Earth 20. Orbital data indicative of the orbit of each satellite 12 is stored in SRAM memory 28 along with digital data indicative of the identification data stream emitted by the particular satellite 12. In this way, at any given time (as tracked by the clock of CPU 22), the approximate location of a particular satellite 12 and the direction in which it is moving may be calculated by CPU 22.

Figure 4:
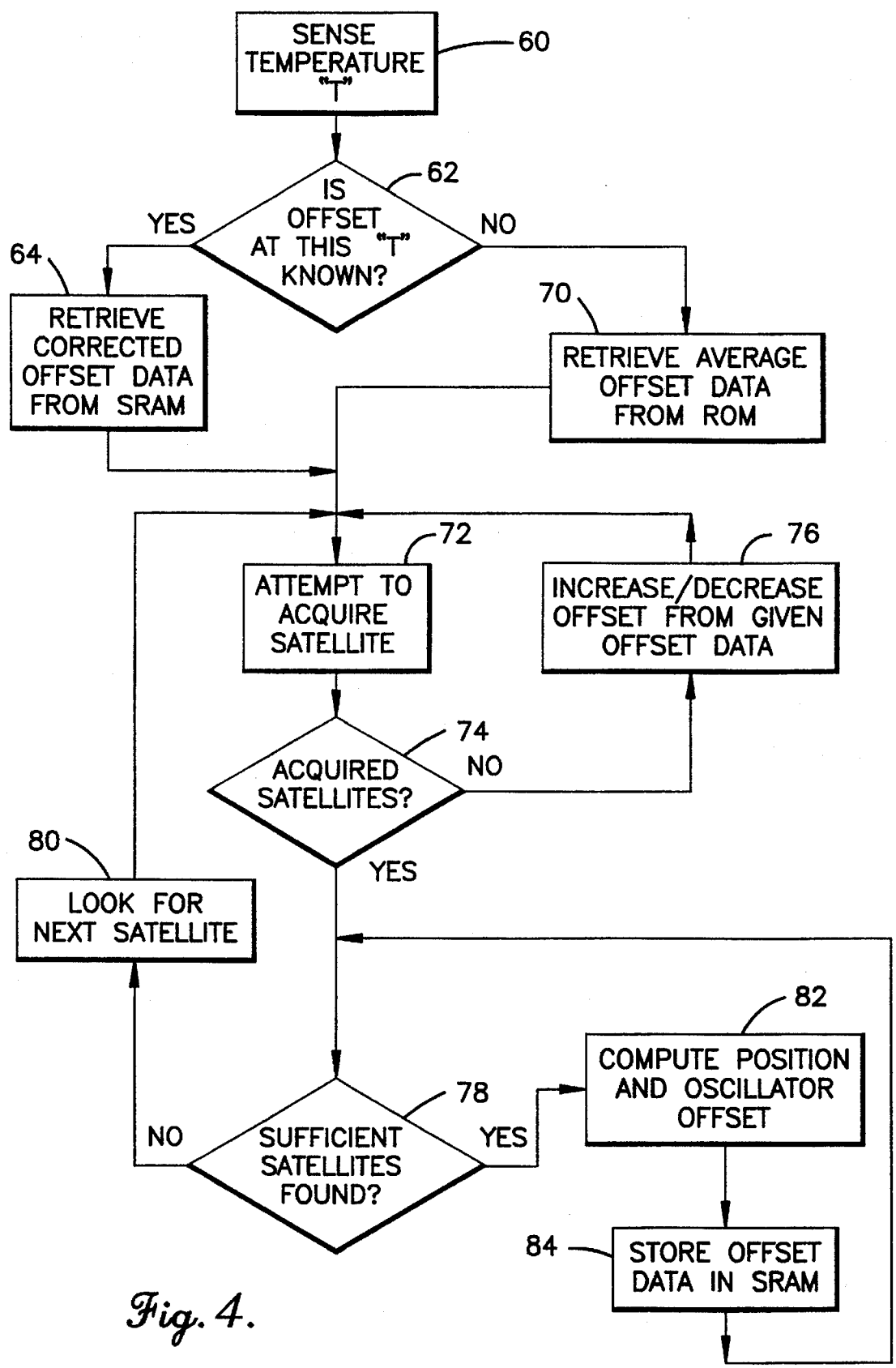
FIG. 4 is a flowchart of the preferred operation of the present invention.

With reference now to FIG. 4, operation of the GPS receiver, and particularly, the software for automatically calibrating the crystal oscillator, is described. As described, each satellite 12 transmits a signal at the same, very specific high frequency. Furthermore, each satellite transmits a digital data stream which includes an identification of that satellite.

GPS receiver device 14, through its GPS receiver\decoder 32, must acquire spread spectrum satellite signals from at least three of the satellites 12 in order for it to calculate its position in two dimensions. Signals from at least four satellites must be acquired in order for the device to calculate its position in three dimensions.

Referring now to FIG. 4, upon activation of GPS receiver device 14, temperature sensor 42 senses the actual temperature at crystal 40, as indicated by reference numeral 60. A signal indicative of the temperature at crystal 40 is sent to, and received by, CPU 22. As indicated at step 62, a logic step, the question is asked whether the exact frequency of oscillation at the temperature "T", which was sensed, is already known from having been previously determined and stored. This logic step is a function of the software of the present invention. The answer to this question is accomplished by probing the Read-Write memory in the static RAM 28 to determine whether the device 14 had previously been operated at this temperature to acquire signals from a sufficient number of satellites to determine the precise oscillation frequency of the crystal 40 and accordingly the position of the receiver. If a value for the sensed temperature T is found in temporary memory 28, then, as indicated at reference numeral 64, the offset frequency at this temperature is known, and accordingly, the data indicative of the frequency offset is retrieved from Read-Write memory 28 by CPU 22. It will be appreciated that, the first time device 14 is used, it will not have an actual offset frequency stored in SRAM memory 28 at any temperature.

If, however, at logic step 62, it is determined that the frequency offset at the sensed temperature "T" is not known, the CPU 22 retrieves data indicative of the average frequency offset from read only memory 26 at the sensed temperature "T", as indicated at step 70.

At this point in the logic, the CPU 22 has either retrieved corrected offset data from read-write memory 28 (as indicated at step 64), or retrieved average offset data from read only memory 26 (as indicated in step 70). As indicated at step 72, GPS receiver device 14 utilizes this data in its attempts to acquire the desired satellite signal.

As indicated at logic step 74, the question is asked whether the desired satellite signal has been found. Particularly the logic asks whether the receiver/decoder 32 has locked onto the desired satellite signal. If the desired satellite signal has not been acquired, the software of the present invention utilizes a programmed offset value to increase and/or decrease the offset value being utilized by CPU 22, as indicated at step 76. For instance, a programmable offset value "X," such as +/−0.5 PPM may be programmed into the software of the present invention. If the desired satellite signal is not acquired, as determined at step 74, the offset value currently utilized is increased and decreased in increments of 0.5 PPM until an acquisition is made. This will be understood from the loop consisting of steps 72, 74 and 76. For instance, if an offset "X" of 0.5 PPM is used, and an acquisition is not made after an initial 0.5 PPM increment and decrement, additional +/−0.5 PPM increments and decrements are made until an acquisition is made.

Once the desired satellite signal 16 has been acquired, the logic of the present invention asks whether a sufficient number of satellites have been found, as indicated at step 78. Particularly, the question is asked whether a sufficient number of satellites has been found in order to determine the location of GPS receiver device 14, and accordingly, to determine the oscillation frequency of the crystal 40. As described above, it is necessary for GPS receiver/decoder 32 to lock on to at least three satellite signals for the device 14 of the present invention to determine its two dimensional position. If, at step 78, an insufficient number of satellites has been found, the device 14 begins its search for the signal emitted from the next satellite, as indicated at step 80. In such a case, where an insufficient number of satellite signals have been locked onto, the device 14 returns to step 72 and begins attempting to acquire the signal from the next satellite and the foregoing described process is repeated.

Once it is determined at step 78, that a sufficient number of satellites are found in order for the device 14 to determine its location, CPU 22 computes the position of the GPS receiver device 14 and also computes the frequency offset of crystal 40, as indicated at step 82. As shown at step 84, data indicative of the frequency offset at the sensed temperature T is stored in Read-Write memory 28, and the device returns to step 78, remaining in the loop consisting of steps 78, 82 and 84 so long as a sufficient number of satellites have been found for the device 14 to remain fixed on the satellite signals it is tracking.

The foregoing logic permits the GPS satellite receiver 14 of the present invention to initially fix onto a sufficient number of spread spectrum satellite signals to determine the oscillation frequency of its crystal oscillator 38 at its present operating temperature and calculate its location and other navigational data. The device and method of the present invention are highly desirable because they permit an uncompensated crystal to be utilized to quickly and inexpensively lock the GPS receiver\decoder 32 onto the required spread spectrum satellite signals. Furthermore, constantly storing corrected offset values, and thereby updating the device 14, has the added benefit of updating drifts associated with long-term drift effects associated with the age of components.

Accordingly, as GPS satellite 14 of the present invention is utilized over time in environments and under conditions having various ambient temperatures, the actual frequency drift offset at such various temperatures at which the receiver device 14 locks on to spread spectrum satellite signals are stored in temporary SRAM memory 28. As a result, the time that it takes the receiver\decoder 32 of the GPS receiver device 14 to initially fix onto the required satellite signals is significantly reduced upon subsequent activation of the device. When such predicted values do not result in acquisition of a satellite signal, the offset technique described above permits the receiver\decoder 32 to quickly acquire the desired satellite signal. Furthermore, once the device 14 has been locked on at every temperature over the operating temperature of the crystal 40, the oscillation frequency thus being known at any given temperature, acquisition of satellite signals can be made very quickly. In this regard, an additional step which may be performed in the construction of the present invention, and which is to be considered a part of the present invention, is repeatedly utilizing the GPS receiver device 14 in a temperature-controlled environment to thereby establish in SRAM memory 28 the actual offset frequency values at selected temperatures.

From the foregoing it will be seen that this invention is one well adapted to attain all ends and objects hereinabove set forth together with the other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative, and not in a limiting sense.

What is claimed is:

1. A GPS satellite receiver device for locking to a signal transmitted from a satellite, the GPS receiver device comprising:

a receiver for receiving the satellite signal;

an oscillator having a crystal, wherein said crystal has an operable temperature range and oscillates at an actual frequency which drifts from a nominal frequency of said crystal over said operable temperature range of said crystal;

a memory device for storing data indicative of said actual frequency at which said crystal oscillates over said operable temperature range of said crystal;

a temperature sensor for sensing temperature in proximity to said crystal and emitting a signal indicative of the temperature sensed; and a processor for receiving said satellite signal and said signal indicative of the temperature sensed and retrieving from said memory the data indicative of the crystal oscillation frequency associated with the sensed temperature, wherein said data is utilized as starting data in an attempt to match said data indicative of the crystal oscillation frequency with data indicative of said frequency of said satellite signal.

2. The GPS satellite receiver device, according to claim 1, wherein said data indicative of said actual frequency at which said crystal oscillates is data indicative of the frequency offset from said nominal frequency.

3. The GPS satellite receiver device, according to claim 2, wherein said processor includes means for adjusting said data indicative of the range of frequency drift at the sensed temperature until said receiver device locks on to said satellite signal.

4. The GPS satellite receiver device, according to claim 3, wherein said processor includes means for adjusting said data indicative of the frequency offset until said receiver device locks on to said satellite signal.

5. The GPS satellite receiver device, according to claim 4, wherein said adjusting means comprise means for incrementing and decrementing said data indicative of the frequency offset a selected amount.

6. A GPS satellite receiver device for locking to a signal transmitted, at a selected frequency, from a satellite, the GPS receiver device comprising:

a receiver for receiving the satellite signal;

an oscillator having a crystal, wherein said crystal has an operable temperature range, a nominal oscillation frequency, and wherein the actual oscillation frequency of said crystal drifts, within a known range of frequency drift, from said nominal frequency over said operable temperature range of said crystal;

a memory means for storing data indicative of said range of frequency drift over said operable temperature range of said crystal;

a temperature sensor for sensing temperature in proximity to said crystal and emitting a signal indicative of the temperature sensed; and a processor for receiving said satellite signal and said signal indicative of the temperature sensed and retrieving from said memory the data indicative of the range of frequency drift of said crystal at the sensed temperature, wherein, when data indicative of said actual oscillation frequency of said crystal matches data indicative of the frequency of said satellite signal, said GPS satellite receiver device locks onto said satellite signal, and when data indicative of said actual oscillation frequency of said crystal does not match data indicative of a selected frequency of said satellite signal, said data initially retrieved from memory is adjusted until it matches said data indicative of the frequency of the satellite signal.

7. The GPS satellite receiver device, according to claim 6, wherein said data indicative of said range of frequency drift over said operable temperature range of said crystal comprises data indicative of the average of said known range of frequency drift at selected temperatures.

8. The GPS satellite receiver device, according to claim 7, wherein said processor includes means for adjusting said data indicative of the range of frequency drift at the sensed temperature until said receiver device locks on to said satellite signal.

9. The GPS satellite receiver device, according to claim 8, wherein said processor includes means for adjusting said data indicative of the frequency offset until said receiver device locks on to said satellite signal.

10. The GPS satellite receiver device, according to claim 9, wherein said adjusting means comprise means for incrementing and decrementing said data indicative of the frequency offset a selected amount.

11. The GPS satellite receiver device, according to claim 10, for receiving and decoding signals transmitted from each of a plurality of satellites wherein said processor computes the position of said receiver when said receiver and decoder have received and decoded at least three of said satellite signals and further computes the actual frequency offset of said oscillator at the sensed temperature, and stores data indicative of said actual frequency offset in said memory.

12. The GPS satellite receiver device, according to claim 11, wherein said memory comprises a read only memory and a read-write memory, wherein said data indicative of said average frequency drift is stored in said read only memory and said data indicative of said actual frequency offset is stored in said read-write memory.

13. A method of calibrating a crystal oscillator in a GPS receiver device having a memory, the receiver for locking onto a signal transmitted from a satellite, the crystal oscillator having a crystal with specified offset frequency characteristics over an operable temperature range, the method comprising:

storing in memory data indicative of the specified offset frequency characteristics of said crystal over the operable temperature range of said crystal;

sensing the temperature of said crystal in operation;

retrieving from said memory data indicative of the offset frequency of the crystal at the temperature sensed and using that data to control said receiver; and adjusting said data indicative of said offset frequency until said receiver device locks onto said satellite signal.

* * * * *